US010770682B2

(12) United States Patent
Kim et al.

(10) Patent No.: US 10,770,682 B2
(45) Date of Patent: Sep. 8, 2020

(54) DISPLAY PANEL AND METHOD FOR FABRICATING THE SAME

(71) Applicant: LG Display Co., Ltd., Seoul (KR)

(72) Inventors: Dohyung Kim, Paju-si (KR);
Seungwon Yoo, Paju-si (KR);
Jonghyeok Im, Paju-si (KR); Jaesung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/222,732

(22) Filed: Dec. 17, 2018

(65) Prior Publication Data

US 2019/0198805 A1    Jun. 27, 2019

(30) Foreign Application Priority Data

Dec. 21, 2017    (KR) .................. 10-2017-0177104

(51) Int. Cl.
*H01L 51/52*    (2006.01)
*H01L 27/32*    (2006.01)

(52) U.S. Cl.
CPC ...... *H01L 51/5253* (2013.01); *H01L 27/3246* (2013.01); *H01L 27/3258* (2013.01); *H01L 27/3276* (2013.01); *H01L 51/5228* (2013.01)

(58) Field of Classification Search
CPC .................................................. H01L 51/5228
See application file for complete search history.

(56) References Cited

U.S. PATENT DOCUMENTS

2016/0086977 A1*    3/2016    Go .................. H01L 27/124
257/773

FOREIGN PATENT DOCUMENTS

KR    10-2014-0074037 A    6/2014
KR    10-2015-0078246 A    7/2015

* cited by examiner

*Primary Examiner* — Peniel M Gumedzoe
*Assistant Examiner* — Christopher A Johnson
(74) *Attorney, Agent, or Firm* — Seed IP Law Group LLP

(57) ABSTRACT

A display panel comprises: a planarization layer that lies on a substrate and compensates for irregularities; an electrode pattern that lies on the planarization layer in a non-display area of the substrate and exposes at least part of the planarization layer; and a moisture-impermeable layer that covers the planarization layer exposed by the electrode pattern.

6 Claims, 6 Drawing Sheets

DISPLAY PANEL AND METHOD FOR FABRICATING THE SAME

CROSS-REFERENCE TO RELATED APPLICATIONS

The present application claims the priority benefit of Korean Patent Application No. 10-2017-0177104, filed on Dec. 21, 2017, which is hereby incorporated by reference in its entirety for all purposes as if fully set forth herein.

BACKGROUND

Technical Field

The present disclosure relates a display panel and a method for fabricating the same.

Description of the Related Art

Organic light-emitting displays, which are a type of flat panel displays, are self-luminous displays that emit light through excitation of organic compounds. In contrast to liquid crystal displays (LCDs), the organic light-emitting displays work without a backlight; thus, organic light-emitting displays can be lighter and thinner and made in a simplified process. Also, the organic light emitting displays are widely used because they can be manufactured at low temperatures, have a fast response time of 1 ms or less, and feature low power consumption, wide viewing angle, and high contrast.

A display panel of an organic light-emitting display is fabricated by forming various arrays of transistors on a substrate. A planarization layer for compensating for irregularities on the substrate is placed on a top layer of the display panel. Gases coming from the planarization layer in the manufacturing process of the display panel need to be released smoothly since they may cause a lot of problems. Along with this, it is necessary to prevent outside moisture (e.g., water) from penetrating the array layer of the substrate after the manufacture of the display panel.

BRIEF SUMMARY

An exemplary embodiment of the present disclosure provides a display panel comprising: a planarization layer that lies on a substrate and compensates for irregularities; an electrode pattern that lies on the planarization layer in a non-display area of the substrate and exposes at least part of the planarization layer; and a moisture-impermeable layer that covers the planarization layer exposed by the electrode pattern.

BRIEF DESCRIPTION OF THE SEVERAL VIEWS OF THE DRAWINGS

The accompany drawings, which are included to provide a further understanding of the disclosure and are incorporated on and constitute a part of this specification, illustrate embodiments of the disclosure and together with the description serve to explain the principles of the disclosure. In the drawings.

DETAILED DESCRIPTION

Figure 1:
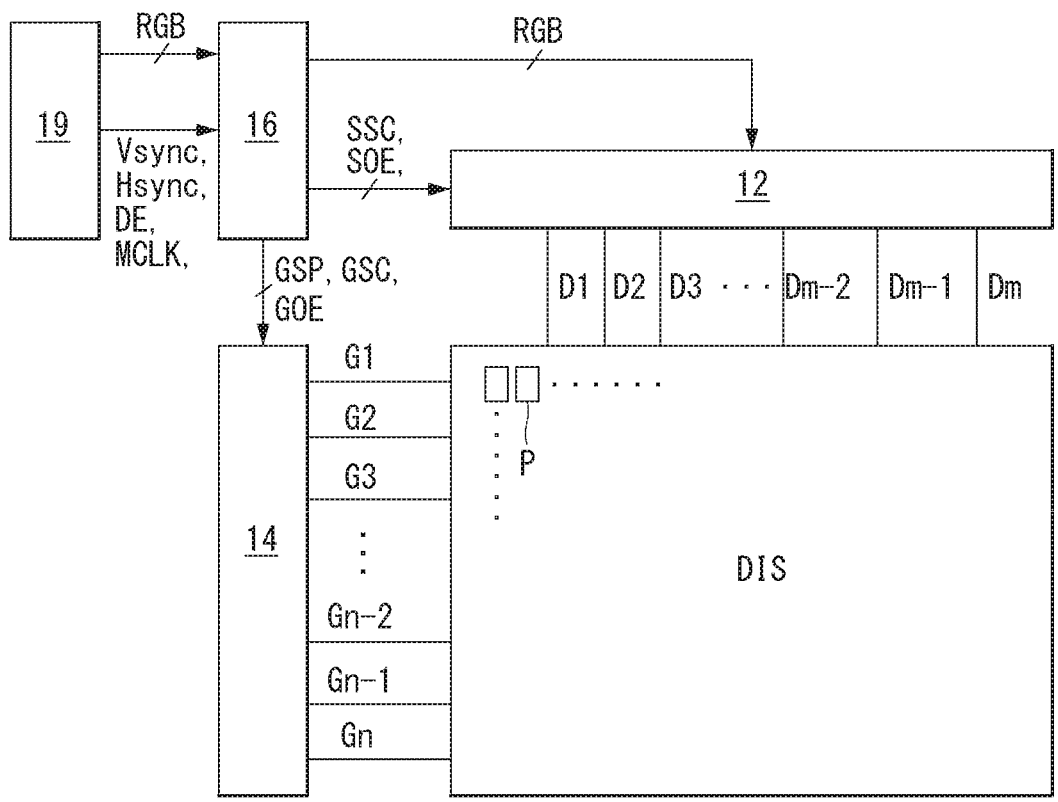
FIG. 1 is a block diagram schematically showing an organic light-emitting display.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. In describing various exemplary embodiments, descriptions of the same or like components will be given in the beginning but omitted in other exemplary embodiments.

The terms including ordinal numbers such as "first" and "second" may be used for describing various components. However, the components shall not be limited by these terms. These terms are used only for the purpose of distinguishing one component from another component.

Figure 2:
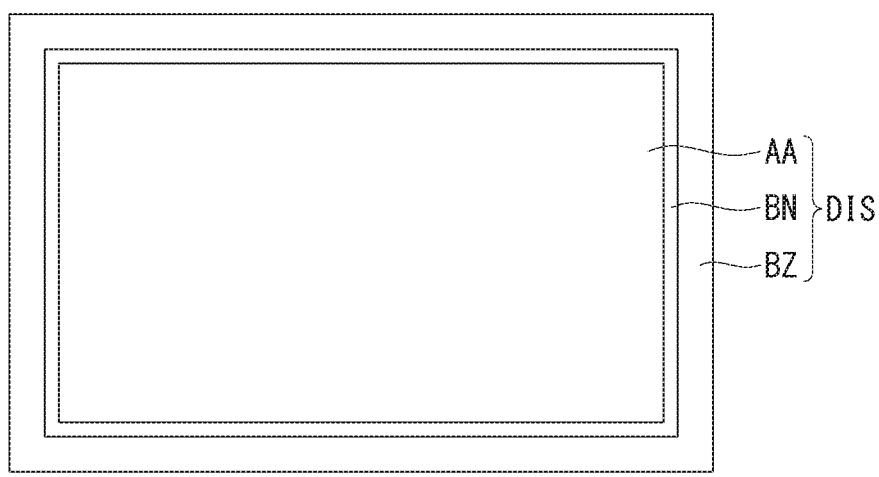
FIG. 2 is a pattern diagram schematically showing a planar array on a display panel.

FIG. 1 is a block diagram schematically showing an organic light-emitting display. FIG. 2 is a pattern diagram schematically showing a planar array on a display panel.

Referring to FIGS. 1 and 2, an organic light-emitting display device 10 according to the present disclosure comprises a display drive circuit and a display panel DIS.

The display drive circuit comprises a data drive circuit 12, a gate drive circuit 14, and a timing controller 16, and writes a video data voltage of an input image to the pixels on the display panel DIS. The data drive circuit 12 converts digital video data RGB received from the timing controller 16 to an analog gamma-compensated voltage and generates a data voltage. The data voltage outputted from the data drive circuit 12 is supplied to data lines D1 to Dm. The gate drive circuit 14 sequentially supplies a gate signal synchronized with the data voltage to gate lines G1 to Gn and selects pixels from the display panel DIS to write the data voltage to.

The timing controller 16 receives timing signals such as a vertical synchronization signal Vsync, a horizontal synchronization signal Hsync, a data enable signal DE, a main clock MCLK, etc., from a host system 19, and synchronizes the operation timings of the data drive circuit 12 and gate drive circuit 14. Data timing control signals for controlling the data drive circuit 12 comprise a source sampling clock SSC, a source output enable signal SOE, etc. Gate timing control signals for controlling the gate drive circuit 14 comprise a gate start pulse GSP, a gate shift clock GSC, a gate output enable signal GOE, etc.

The host system 19 may be implemented as any one of the following: a television system, a set-top box, a navigation system, a DVD player, a Blue-ray player, a personal computer PC, a home theater system, and a phone system. The host system 19 comprises a system-on-chip (SoC) with a scaler embedded in it, and converts digital video data RGB of an input image into a format suitable for displaying on the display panel DIS. The host system 19 transmits the timing signals Vsync, Hsync, DE, and MCLK, along with the digital video data, to the timing controller 16.

The display panel DIS comprises a display area AA where pixels P are arranged and a non-display area BZ surrounding the display area AA. The display area AA comprises pixels P that are defined by the data lines D1 to Dm (m is a positive integer) and the gate lines G1 to Gn (n is a positive integer). Each pixel P comprises an organic light-emitting diode which is a self-luminous element. A gate driver may be placed in the non-display area BZ in the form of a gate-in-panel (GIP). The display area AA and the non-display area BZ are sectioned off by a bank layer BN.

Figure 3:
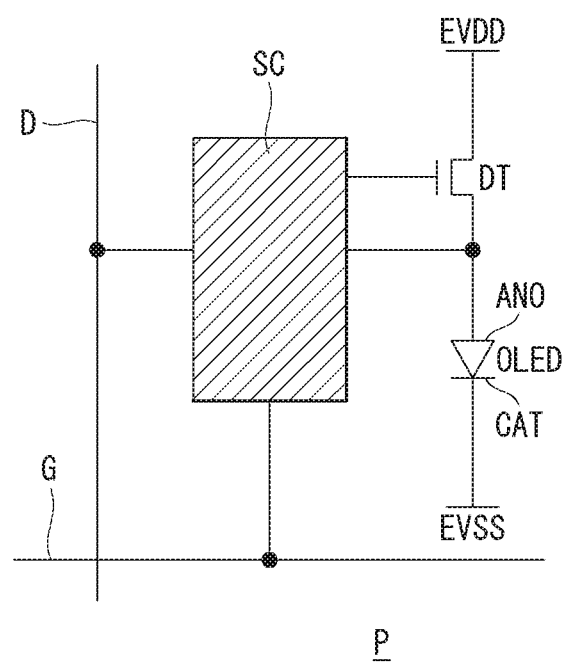
FIG. 3 is a view schematically showing a circuit configuration of a pixel.

FIG. 3 is a view schematically showing a circuit configuration of a pixel.

As shown in FIG. 3, the pixels P are connected to the data lines D and the gate lines G. Each pixel P comprises an organic light-emitting diode OLED, a driving transistor DT that controls the amount of current flowing in the organic light-emitting diode OLED, and a programming part SC that controls the operation of the driving transistor DT. The programming part SC is a combination of one or more transistors and one or more capacitors, and controls voltages of primary nodes, for example, the gate and source electrodes of the driving transistor DT. In an example, the programming part SC writes a data voltage received from a data line D to itself, in response to a gate pulse applied form a gate line G. The driving transistor DT supplies a drive current proportional to the amount of data voltage written to the programming part SC to the organic light-emitting diode OLED. The organic light-emitting diode OLED emits light in proportion to the amount of drive current supplied from the driving transistor DT. The organic light-emitting diode OLED comprises an anode ANO, a cathode CAT, and an organic compound layer interposed between the anode ANO and cathode CAT. The anode ANO is connected to the driving transistor DT.

Figure 4:
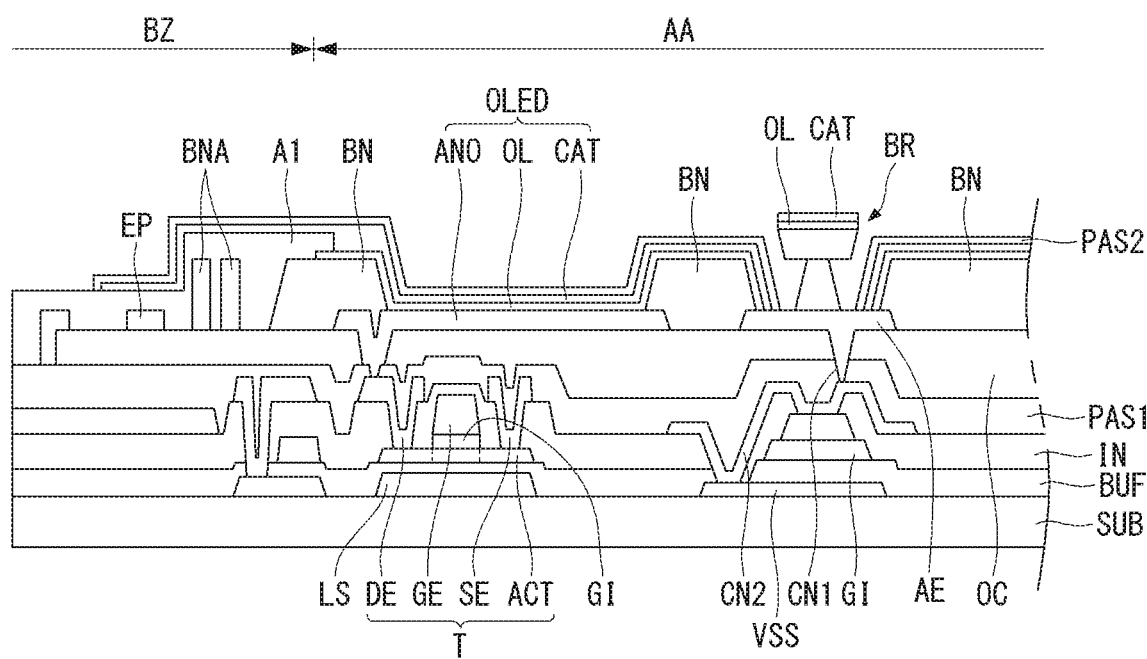
FIG. 4 is a view showing an organic light-emitting display according to the present disclosure.

FIG. 4 is a view showing an organic light-emitting display according to the present disclosure.

Referring to FIG. 4, the organic light-emitting display according to the present disclosure comprises transistors T formed on a substrate SUB and an organic light-emitting diode OLED.

The substrate SUB may be made of a glass or plastic material. For example, the substrate SUB may be made of a plastic material such as PI (polyimide), PET (polyethylene terephthalate), PEN (polyethylene naphthalate), and PC (polycarbonate), and may have flexibility.

A light shielding layer LS and a low-level voltage line VSS are placed on the substrate SUB. The light shielding layer LS is disposed to overlap a semiconductor layer, particularly, channel, of the transistor T on the plane, and serves to protect oxide semiconductor devices from external light.

A buffer layer BUF is disposed to cover the light shielding layer LS and the low-level voltage line VSS. The buffer layer BUF serves to block ions or impurities diffused from the substrate SUB and prevents external moisture penetration.

A semiconductor layer ACT is placed on the buffer layer BUF. An insulating layer formed on the buffer layer BUF to cover the semiconductor layer ACT is patterned so that a gate insulating layer GI is located where a gate electrode GE is formed.

The gate insulating layer GI is for insulating the gate electrode GE, and may be made of a silicon oxide layer SiOx.

The gate electrode GE is placed on the gate insulating layer GI.

The gate electrode GE is disposed to face the semiconductor layer ACT, with the gate insulating layer GI in between. The gate electrode GE may consist of a single layer or multilayers made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W), or a combination thereof.

An interlayer insulating layer IN is disposed on the buffer layer BUF to cover the gate electrode GE. The interlayer insulating layer IN is for insulating the gate electrode GE and the source and drain electrodes SE and DE, and may consist of a silicon oxide layer (SiOx), a silicon nitride layer (SiNx), or multiple layers thereof.

The source and drain electrodes SE and DE and a second auxiliary connecting portion CN2 are placed over the interlayer insulating layer IN.

The source electrode SE and the drain electrode DE are spaced a predetermined distance apart. The source electrode SE comes into contact with one side of the semiconductor layer ACT via a source contact hole formed through the interlayer insulating layer IN. The drain electrode DE comes into contact with the other side of the semiconductor layer ACT via a drain contact hole formed through the interlayer insulating layer IN. The source electrode SE and the drain electrode DE may consist of a single layer or multiple layers. If the source electrode SE and the drain electrode DE consist of a single layer, they may be made of any one selected from the group consisting of molybdenum (Mo), aluminum (Al), chrome (Cr), gold (Au), titanium (Ti), nickel (Ni), neodymium (Nd), copper (Cu), or a combination thereof. If the source electrode SE and the drain electrode DE consist of multiple layers, they may be composed of two layers of molybdenum/aluminum-neodymium, molybdenum/aluminum, titanium/aluminum, or copper/molytitanium, or three layers of molybdenum/aluminum-neodymium/molybdenum, molybdenum/aluminum/molybdenum, titanium/aluminum/titanium, or molytitanium/copper/molytitanium.

The second auxiliary connecting portion CN2 is connected to the first auxiliary connecting portion CN1. Also, the second auxiliary connecting portion CN2 is formed through the buffer layer BUF and the interlayer insulating layer IN and connected to the low-level voltage line VSS.

The semiconductor layer ACT, gate electrode GE, and source and drain electrodes SE and DE constitute the transistor T.

A first passivation layer PAS1 lies over the transistor T. The first passivation layer PAS1 is for protecting the transistor T, and may consist of a silicon oxide layer (SiOx), a silicon nitride layer (SiNx), or multiple layers thereof.

A planarization layer OC lies on the first passivation layer PAS1. The planarization layer OC is for compensating for irregularities on the substrate SUB by smoothing out irregularities in the underlying structure, and may be made of an organic material such as photoacryl, polyimide, benzocyclobutene resin, or acrylate resin. If necessary, either the first passivation layer PAS1 or the planarization layer OC may be omitted.

On the planarization layer OC, the anode ANO and an auxiliary electrode AE are located in the display area AA, and an electrode pattern EP is located in the non-display area BZ.

The anode ANO is connected to the drain electrode DE of the transistor T via a contact hole formed through the first passivation layer PAS1 and the planarization layer OC. The anode ANO consists of multiple layers comprising a reflective layer and may function as a reflective electrode. The reflective layer may be made of aluminum (Al), copper (Cu), silver (Ag), nickel (Ni), molybdenum (Mo), molytitanium (MoTi), etc.

The auxiliary electrode AE may be made of the same material on the same layer as the anode ANO. In this case, there is no need to perform a separate process for forming the auxiliary electrode AE, thereby reducing the manufacturing time and costs.

The electrode pattern EP applies a low-level voltage EVSS supplied from a power supply part (not shown) to the cathode CAT.

The anode ANO, auxiliary electrode AE, and electrode pattern EP may be formed of the same material in the same process.

A bank layer BN and an auxiliary bank layer BNA lie on the substrate SUB where the anode ANO, auxiliary electrode AE, and electrode pattern EP are formed. The bank layer BN marks the boundaries between each pixel P. The bank layer BN on the outer perimeter of the display area AA separates the display area AA and the non-display area BZ off from each other. The auxiliary bank layer BNA is located in the non-display area BZ and prevents movement of a dam (not shown) located in the non-display area BZ. The bank layer BN and the auxiliary bank layer BNA may be made of an organic material such as polyimide, benzocyclobutene resin, or acrylate resin.

The bank layer BN may be disposed to expose the center of the anode ANO and cover the side edge of the anode ANO. It is desirable that the anode ANO is designed to have as large an exposed area as possible, so as to secure a sufficiently high aperture ratio. Moreover, the bank layer BN may be disposed to expose the center of the auxiliary electrode AE and cover the side of the auxiliary electrode AE.

The electrode pattern EP may have one or more electrode members (not shown). The electrode members may be positioned at first locations on the planarization layer OC in a non-display area of the substrate SUB. The second locations, different from the first locations, are those locations where the electrode members are not positioned on the planarization layer OC.

A barrier BR lies above the auxiliary electrode AE. The barrier BR functions to physically separate the organic emissive layer OL, cathode CAT, and second passivation layer PAS2 to be formed later. In other words, the organic emissive layer OL, cathode CAT, and second passivation layer PAS2 on the auxiliary electrode AE may be physically separated by the barrier BR and become discontinuous.

The organic emissive layer OL lies over the substrate SUB where the barrier BR is formed. The organic emissive layer OL may be formed across the entire surface of the substrate SUB.

The organic emissive layer OL on the auxiliary electrode AE is physically separated by the barrier BR. The organic emissive layer OL is separated by the barrier BR and exposes at least part of the auxiliary electrode AE in the neighboring region of the barrier BR. Part of the organic emissive layer OL separated by the barrier BR lies on top of the barrier BR.

A moisture-impermeable layer A1 is formed in the non-display area BZ so as to cover the edge of the organic emissive layer OL. The moisture-impermeable layer Al may be disposed to cover the auxiliary bank layer BNA and electrode pattern EP in the non-display area BZ and block the planarization layer OC. The moisture-impermeable layer A1 may be made of a conductive material such as aluminum (Al).

The cathode CAT lies over the organic emissive layer OL. The cathode CAT may be formed widely across the entire surface of the substrate SUB. The cathode CAT may be formed of a transparent conductive material such as ITO (indium tin oxide) or IZO (indium zinc oxide), and may be made of magnesium (Mg), calcium (Ca), aluminum (Al), silver (Ag), or an alloy thereof that is made thin enough to allow light to pass through.

The cathode CAT on the auxiliary electrode AE is physically separated by the barrier BR. The cathode CAT is separated by the barrier BR and exposes at least part of the auxiliary electrode AE in the neighboring region of the barrier BR. Part of the cathode CAT separated by the barrier BR lies on top of the barrier BR.

The cathode CAT is formed to cover the organic emissive layer OL, with one end making direct contact with the auxiliary electrode AE. That is, one end of the cathode CAT separated by the barrier BR and exposed makes direct contact with the exposed top surface of the auxiliary electrode AE. Such a structure may be implemented by the difference in step coverage between the materials of the organic emissive layer OL and cathode CAT. For example, the cathode CAT may make direct contact with the auxiliary electrode AE since it may be made of a transparent conductive material that has higher step coverage than the material of the organic emissive layer OL.

The cathode CAT may cover the moisture-impermeable layer A1 in the non-display area BZ and extend to a region closely adjacent to the electrode pattern EP. Since the moisture-impermeable layer A1 is made of a conductive material, the low-level voltage EVSS the electrode pattern EP receives is supplied to the cathode CAT through the moisture-impermeable layer A1.

The second passivation layer PAS2 is formed on the cathode CAT. The second passivation layer PAS2 may be disposed to cover the entire surface of the display area AA and cover the cathode CAT in the non-display area BZ.

FIGS. 5 to 9 are views showing a method for fabricating a display device according to the present disclosure. The following description will be given focusing on how the non-display area is formed, with reference to FIGS. 5 to 9.

Figure 5:
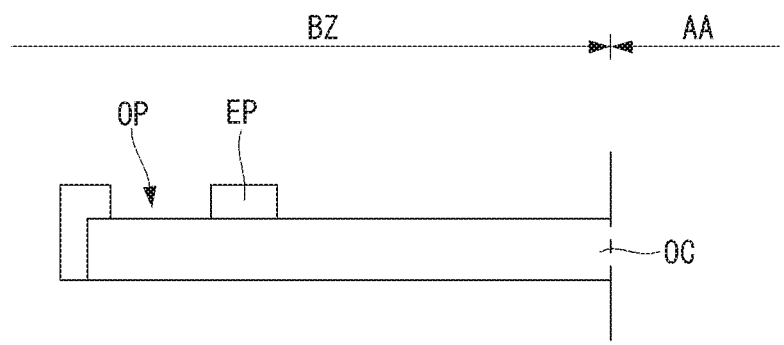
FIGS. 5 to 9 are views showing a method for fabricating an organic light-emitting display according to the present disclosure.

Referring to FIG. 5, the electrode pattern EP is formed on the planarization layer OC. The electrode pattern EP may be formed simultaneously with the anode ANO. That is, the anode ANO is formed to cover the side of the planarization layer OC, and then the anode ANO is patterned to have an open region OP exposing the planarization layer OC, thereby leaving the electrode pattern EP. The open region OP exposes the planarization layer OC and therefore facilitates the release of gases generated from organic matter such as the planarization layer OC in the manufacturing process of the display panel DIS. In one embodiment, the open region OP may correspond to second locations where the electrode members in the pattern EP are not placed, whereas the first locations may indicate locations where the electrode members of the electrode pattern EP are placed on the planarization layer OC in the non-display are of the substrate SUB.

Figure 6:
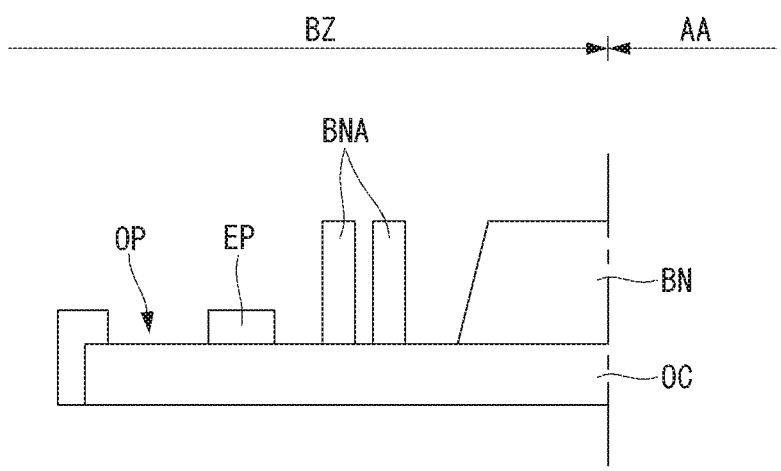

Referring to FIG. 6, the auxiliary bank layer BNA is formed along with the bank layer BN.

Figure 7:
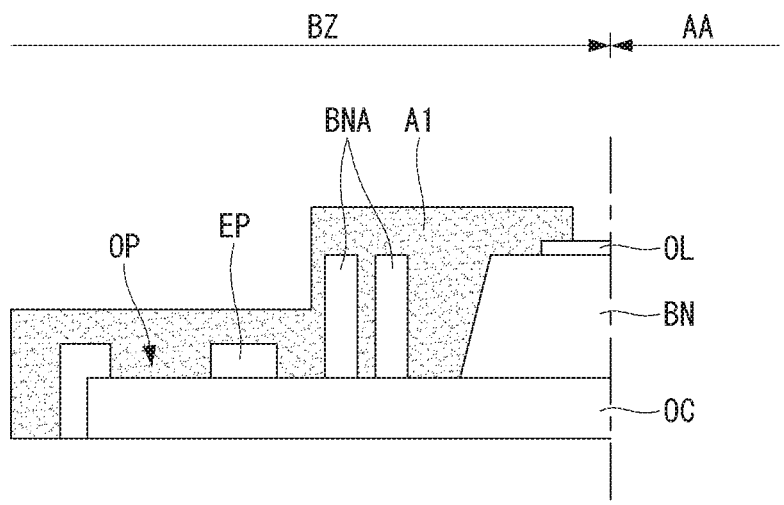

Referring to FIG. 7, the organic emissive layer OL is formed to cover the anode ANO and the bank layer BN. Next, the moisture-impermeable layer A1 is formed to cover the edge of the organic emissive layer OL, the auxiliary bank layer BNA, and the electrode pattern EP. Preferably, the moisture-impermeable layer A1 is formed in such a manner as to fully cover the open region OP.

Figure 8:
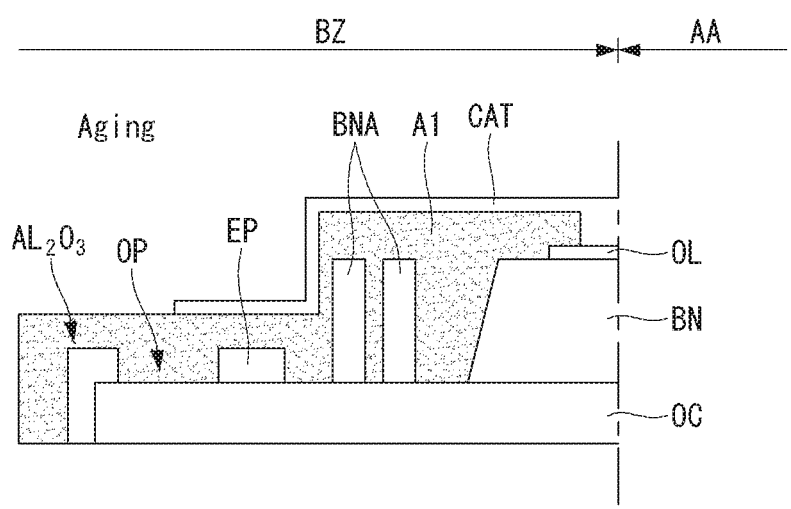

Referring to FIG. 8, the cathode CAT is formed on the moisture-impermeable layer A1. The cathode CAT may be formed in such a manner as to cover the region overlying the electrode pattern EP. In one embodiment, the cathode CAT overlies the first locations of the electrode members of the electrode pattern EP and does not overlie some part of the second locations on the planarization layer OC. An aging process is carried out after the formation of the cathode. The moisture-impermeable layer A1 exposed out of the cathode CAT by the aging process is oxidized by aluminum oxide ($Al_2O_3$). For example, the second locations where the electrode members are not placed and not overlain by the cathode CAT may expose the moisture-impermeable layer A1 and allow the layer to be oxidized by aluminum oxide ($Al_2O_3$). Aluminum oxide ($Al_2O_3$) provides higher moisture impermeability than aluminum (Al). That is, the aging process gives the moisture-impermeable layer A1 around the open region OP higher moisture impermeability and allows the region covering the electrode pattern EP to be kept in the form of aluminum metal to maintain high conductivity.

Figure 9:
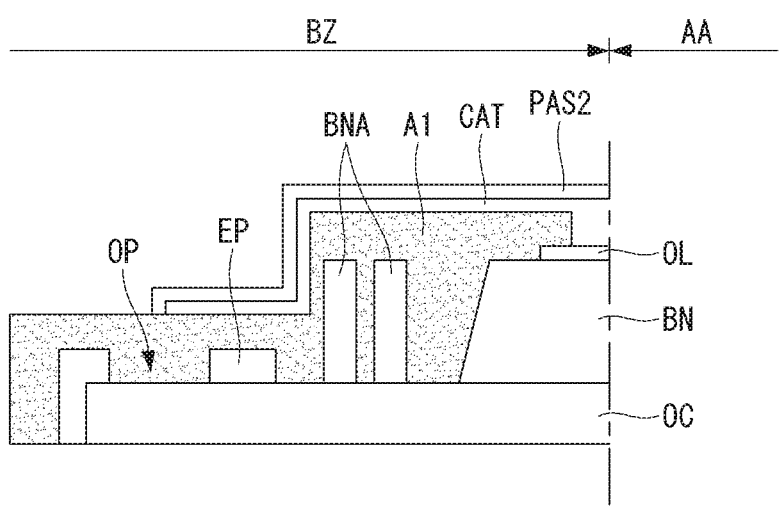

Referring to FIG. 9, the second passivation layer PAS2 may be formed so as to cover the moisture-impermeable layer A1.

The present disclosure allows for efficient outgassing from the planarization layer in the process of fabricating a display panel using an electrode pattern that is configured to expose the planarization layer.

Moreover, the present disclosure may prevent moisture penetration into the planarization layer after the manufacture of the display panel, since a space serving as a path of outgassing from the planarization layer is covered with a metal pattern.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
    a planarization layer that lies on a substrate and forms a planar upper surface;
    an electrode pattern having electrode members positioned at first locations on the planarization layer in a non-display area of the substrate, and no electrode members at second locations;
    a moisture-impermeable layer that covers the planarization layer, the moisture-impermeable layer being in contact with the electrode members at the first locations and in contact with the planarization layer at the second locations; and
    an organic light-emitting diode that lies on the planarization layer in a display area, wherein a cathode of the organic light-emitting diode is in contact with the moisture-impermeable layer,
    wherein the moisture-impermeable layer is made of a conductive metal material, and the electrode pattern receives a low-level voltage and applies the same to the cathode.

2. The display panel of claim 1, further comprising a bank layer that lies on the planarization layer and divides the substrate into the display area and the non-display area.

3. The display panel of claim 1, wherein the moisture-impermeable layer is made of aluminum.

4. The display panel of claim 1, wherein the cathode partially overlies the moisture-impermeable layer.

5. A display panel, comprising:
    a planarization layer that lies on a substrate and forms a planar upper surface;
    an organic emissive layer overlying the planarization layer;
    an electrode pattern having electrode members positioned at first locations on the planarization layer in a non-display area of the substrate, and no electrode members at second locations;
    a moisture-impermeable layer that covers the planarization layer, the moisture-impermeable layer being in contact with a part of the organic emissive layer, in contact with the electrode members at the first locations, and in contact with the planarization layer at the second locations; and
    a cathode that overlies the organic emissive layer and the moisture-impermeable layer,
    wherein the moisture-impermeable layer is composed of an electrically conductive metallic aluminum.

6. The display panel of claim 5, wherein the cathode overlies the electrode members of the electrode pattern at the first locations and not overlies at the second locations for aging the moisture-impermeable layer.

* * * * *